(12) United States Patent
Tamasaki

(10) Patent No.: US 9,159,900 B2
(45) Date of Patent: Oct. 13, 2015

(54) SURFACE ACOUSTIC WAVE DEVICE

(71) Applicant: Murata Manufacturing Co., Ltd., Nagaokakyo-shi, Kyoto-fu (JP)

(72) Inventor: Daisuke Tamasaki, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 104 days.

(21) Appl. No.: 13/930,238

(22) Filed: Jun. 28, 2013

(65) Prior Publication Data

US 2013/0285504 A1 Oct. 31, 2013

Related U.S. Application Data

(63) Continuation of application No. PCT/JP2011/078778, filed on Dec. 13, 2011.

(30) Foreign Application Priority Data

Dec. 29, 2010 (JP) ................................. 2010-294555

(51) Int. Cl.
  *H03H 9/25* (2006.01)
  *H01L 41/047* (2006.01)
  *H01L 41/053* (2006.01)
  *H03H 9/02* (2006.01)
  *H03H 9/145* (2006.01)
  *H03H 9/64* (2006.01)

(52) U.S. Cl.
  CPC ......... *H01L 41/053* (2013.01); *H03H 9/02574* (2013.01); *H03H 9/14541* (2013.01); *H03H 9/6483* (2013.01); *H03H 9/0222* (2013.01)

(58) Field of Classification Search
  CPC ....................................................... H03H 9/25
  USPC ........................... 310/313 R, 313 B, 340, 364
  See application file for complete search history.

(56) References Cited

U.S. PATENT DOCUMENTS

| | | | |
|---|---|---|---|
| 7,573,178 B2 * | 8/2009 | Inoue et al. ................ | 310/313 R |
| 7,939,989 B2 * | 5/2011 | Solal et al. ................. | 310/313 B |
| 2004/0164644 A1 | 8/2004 | Nishiyama et al. | |

(Continued)

FOREIGN PATENT DOCUMENTS

| DE | 10 2006 022 580 A1 | 11/2007 |
|---|---|---|
| DE | 11 2007 001 259 T5 | 6/2009 |

(Continued)

OTHER PUBLICATIONS

Official Communication issued in International Patent Application No. PCT/JP2011/078778, mailed on Feb. 14, 2012.

(Continued)

*Primary Examiner* — Thomas Dougherty
(74) *Attorney, Agent, or Firm* — Keating & Bennett, LLP

(57) ABSTRACT

A surface acoustic wave device includes a piezoelectric substrate, an IDT electrode provided on the piezoelectric substrate, a first dielectric layer, and a second dielectric layer. The first dielectric layer is provided on the piezoelectric substrate and made of silicon oxide. The second dielectric layer is provided on the first dielectric layer and has an acoustic velocity greater than that of the first dielectric layer. A third dielectric layer is provided between the first dielectric layer and the piezoelectric substrate, and arranged to cover a surface of the piezoelectric substrate and an upper surface and side surfaces of the IDT electrode.

16 Claims, 4 Drawing Sheets

(56) References Cited

U.S. PATENT DOCUMENTS

| | | |
|---|---|---|
| 2005/0281210 A1 | 12/2005 | Makino |
| 2007/0214622 A1* | 9/2007 | Nishiyama et al. .......... 29/25.35 |
| 2008/0067891 A1* | 3/2008 | Matsuda et al. .......... 310/313 R |
| 2008/0303379 A1 | 12/2008 | Nakai et al. |
| 2009/0058225 A1 | 3/2009 | Kadota |
| 2009/0128260 A1 | 5/2009 | Block et al. |
| 2010/0060102 A1 | 3/2010 | Goto et al. |
| 2012/0161577 A1* | 6/2012 | Abbott et al. ............. 310/313 C |

FOREIGN PATENT DOCUMENTS

| | | |
|---|---|---|
| EP | 2 093 881 A1 | 8/2009 |
| JP | 06-164293 A | 6/1994 |
| JP | 11-088102 A | 3/1999 |
| JP | 2001-044787 A | 2/2001 |
| JP | 2002-084156 A | 3/2002 |
| JP | 2004-112748 A | 4/2004 |
| JP | 2004-297369 A | 10/2004 |
| JP | 2006-121233 A | 5/2006 |
| JP | 2007-235711 A | 9/2007 |
| WO | 2005/083881 A1 | 9/2005 |
| WO | 2007/097186 A1 | 8/2007 |

OTHER PUBLICATIONS

Official Communication issued in corresponding German Patent Application No. 11 2011 104 653.7, mailed on Feb. 26, 2014.
Official Communication issued in corresponding German Patent Application No. 11 2012 002 502.4, mailed on Jul. 8, 2014.

* cited by examiner

SURFACE ACOUSTIC WAVE DEVICE

BACKGROUND OF THE INVENTION

1. Field of the Invention

The present invention relates to a surface acoustic wave device used for a resonator, a band pass filter, or other suitable devices.

2. Description of the Related Art

Heretofore, a surface acoustic wave device that utilizes a surface acoustic wave has been widely used as, for example, a resonator or a filter device. For example, in Japanese Unexamined Patent Application Publication No. 2001-44787, as one example of such a surface acoustic wave device, a surface acoustic wave device is disclosed which includes a $SiO_2$ film formed on a piezoelectric substrate so as to cover an IDT electrode and a SiN film formed on the $SiO_2$ film.

As a result of the $SiO_2$ film being formed so as to cover the IDT electrode, the surface acoustic wave device disclosed in Japanese Unexamined Patent Application Publication No. 2001-44787 has excellent frequency temperature characteristics. In addition, in the surface acoustic wave device disclosed in Japanese Unexamined Patent Application Publication No. 2001-44787, when the thickness of the SiN film formed on the $SiO_2$ film is adjusted, the frequency characteristics of the surface acoustic wave device can be adjusted. Thus, the frequency accuracy can be improved.

However, in the surface acoustic wave device disclosed in Japanese Unexamined Patent Application Publication No. 2001-44787, for example, spurious response may be disadvantageously generated between a resonant frequency and an anti-resonant frequency or in a passband due to an unnecessary wave.

SUMMARY OF THE INVENTION

Preferred embodiments of the present invention provide a surface acoustic wave device that prevents or decreases degradation in frequency characteristics caused by an unnecessary wave.

A surface acoustic wave device according to a preferred embodiment of the present invention includes a piezoelectric substrate, an IDT electrode, a first dielectric layer, and a second dielectric layer. The IDT electrode is provided on the piezoelectric substrate. The first dielectric layer is provided on the piezoelectric substrate. The first dielectric layer is preferably made of silicon oxide. The second dielectric layer is provided on the first dielectric layer. The second dielectric layer has an acoustic velocity greater than that of the first dielectric layer. The surface acoustic wave device according to this preferred embodiment of the present invention may preferably further include a third dielectric layer. The third dielectric layer is disposed between the first dielectric layer and the piezoelectric substrate. The third dielectric layer covers a surface of the piezoelectric substrate and an upper surface and side surfaces of the IDT electrode.

In a preferred embodiment of the surface acoustic wave device according to the present invention, the thickness of the third dielectric layer is preferably at least about 1.5% of the wavelength determined by the pitch between electrode fingers of the IDT electrode, for example. With this structure, the degradation in frequency characteristics caused by an unnecessary wave is more effectively prevented or decreased.

In another preferred embodiment of the surface acoustic wave device according to the present invention, the thickness of the third dielectric layer is preferably equal to or less than that of the first dielectric layer, for example.

In another preferred embodiment of the surface acoustic wave device according to the present invention, the third dielectric layer is preferably made of silicon nitride, silicon oxynitride, diamond, alumina, or aluminum nitride, for example.

In another preferred embodiment of the surface acoustic wave device according to the present invention, the second dielectric layer is preferably made of silicon nitride, silicon oxynitride, diamond, alumina, or aluminum nitride, for example.

In another preferred embodiment of the surface acoustic wave device according to the present invention, the piezoelectric substrate is preferably made of $LiNbO_3$ or $LiTaO_3$, for example.

In another preferred embodiment of the surface acoustic wave device of the present invention, the piezoelectric substrate is preferably a 120° to 130° rotated Y-cut X-propagation $LiNbO_3$ substrate. In this structure, when the Rayleigh wave is used as a main mode, and the SH wave is set as an unnecessary wave, the degradation in frequency characteristics caused by the SH wave, which is an unnecessary wave, can be more effectively reduced or prevented.

In another preferred embodiment of the surface acoustic wave device according to the present invention, the piezoelectric substrate is preferably a −10° to 10° rotated Y-cut X-propagation $LiNbO_3$ substrate, for example. In this structure, when the SH wave is used as a main mode, and the Rayleigh wave is set as an unnecessary wave, the degradation in frequency characteristics caused by the Rayleigh wave, which is an unnecessary wave, is more effectively prevented or decreased.

With the surface acoustic wave devices according to various preferred embodiments of the present invention, the third dielectric layer is provided between the first dielectric layer and the piezoelectric substrate so as to cover the surface of the piezoelectric substrate and the upper surface and the side surfaces of the IDT electrode. Thus, the degradation in frequency characteristics caused by an unnecessary wave is prevented or decreased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Hereinafter, as a preferred embodiment of the present invention, a ladder type surface acoustic wave filter device 1 shown in FIG. 1 will be described as non-limiting example. However, the surface acoustic wave filter device 1 is merely one example. Preferred embodiments of the present invention are not limited to the surface acoustic wave filter device 1. The surface acoustic wave device according to preferred embodiments of the present invention may be, for example, either a surface acoustic wave branching filter or a surface acoustic wave resonator. In addition, the surface acoustic wave device according to preferred embodiments of the present invention may be, for example, a longitudinally coupled resonator-type surface acoustic wave filter device.

Figure 1:
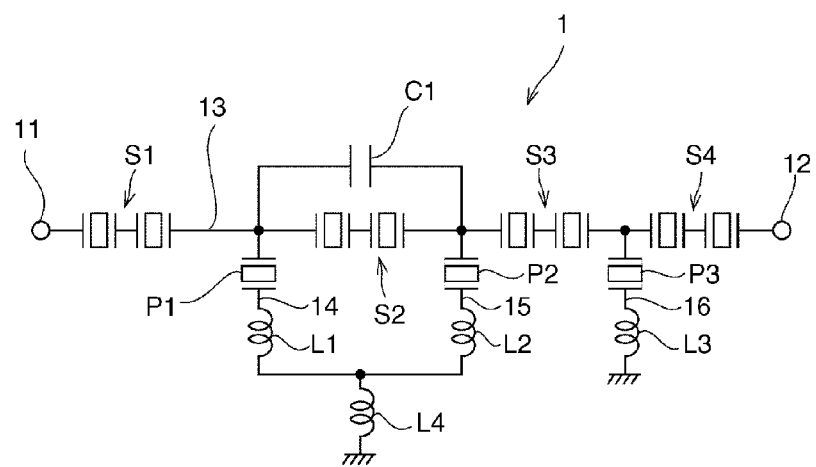
FIG. 1 is a schematic circuit diagram of a surface acoustic wave filter according to a first preferred embodiment of the present invention.

As shown in FIG. 1, the surface acoustic wave filter device 1 includes a first signal terminal 11 and a second signal terminal 12. The first and the second signal terminals 11 and 12 are connected to each other with a series arm 13 provided therebetween. Along the series arm 13, series arm resonators S1 to S4 are connected in series. To the series arm resonator S2, a capacitor C1 is connected in parallel. The series arm 13 and the ground potential are connected through parallel arms 14 to 16. The parallel arms 14 to 16 are provided with parallel arm resonators P1 to P3, respectively. Between the parallel arm resonator P1 and the ground potential, an inductor L1 is connected. Between the parallel arm resonator P2 and the ground potential, an inductor L2 is connected. Between the ground potential and the inductors L1 and L2, an inductor L4 is connected. Between the parallel arm resonator P3 and the ground potential, an inductor L3 is connected.

Figure 2:
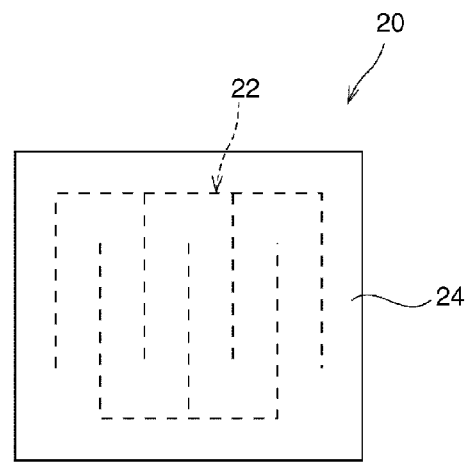
FIG. 2 is a schematic plan view of a surface acoustic wave resonator in the first preferred embodiment of the present invention.
Figure 3:
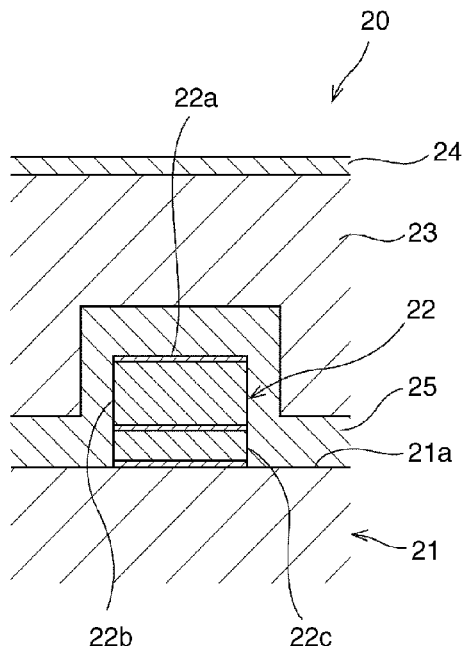
FIG. 3 is a partially enlarged schematic cross-sectional view of the surface acoustic wave resonator in the first preferred embodiment of the present invention.

The series arm resonators S1 to S4 and the parallel arm resonators P1 to P3 each include at least one surface acoustic wave resonator. A schematic plan view of such a surface acoustic wave resonator 20 is shown in FIG. 2, and a partially enlarged schematic cross-sectional view thereof is shown in FIG. 3.

The surface acoustic wave resonator 20 includes a piezoelectric substrate 21. The piezoelectric substrate 21 may preferably be made of, for example, $LiNbO_3$ or $LiTaO_3$. The piezoelectric substrate 21 may preferably be, for example, a 120° to 130° rotated Y-cut X-propagation $LiNbO_3$ substrate or a −10° to 10° rotated Y-cut X-propagation $LiNbO_3$ substrate.

On a primary surface 21a of the piezoelectric substrate 21, an IDT electrode 22 is provided. The IDT electrode 22 includes a pair of comb-shaped electrodes which are alternately arranged side by side. The IDT electrode 22 may be made of any appropriate electrically conductive material. The IDT electrode 22 may preferably be made of, for example, a metal selected from the group consisting of Al, Pt, Au, Ag, Cu, Ni, Ti, Cr, and Pd or an alloy including at least one metal selected from the group consisting of Al, Pt, Au, Ag, Cu, Ni, Ti, Cr, and Pd. In addition, the IDT electrode 22 may also preferably be defined by a laminate of electrical conductive layers made of the above-mentioned metals and/or alloys.

On the primary surface 21a, a first dielectric layer 23 is provided. The first dielectric layer 23 is preferably made of silicon oxide, for example. Thus, the first dielectric layer 23 has a temperature coefficient of frequency (TCF) with a positive or negative slope opposite to that of the piezoelectric substrate 21. Accordingly, since the first dielectric layer 23 is provided, the frequency temperature characteristics of the surface acoustic wave resonator 20 are improved. As a result, the frequency temperature characteristics of the surface acoustic wave filter device 1 are improved.

The thickness of the first dielectric layer 23 is not particularly limited as long as an elastic wave excited at the IDT electrode 22 is allowed to become a surface acoustic wave. The thickness of the first dielectric layer 23 may preferably be set, for example, in a range from approximately the electrode thickness to about $0.5\lambda$ ($\lambda$ is the wavelength determined by the pitch between electrode fingers of the IDT electrode).

On the first dielectric layer 23, a second dielectric layer 24 is provided. The first dielectric layer 23 is covered with this second dielectric layer 24. The second dielectric layer 24 has an acoustic velocity greater than that of the first dielectric layer 23. The second dielectric layer 24 may preferably be made of, for example, silicon nitride, silicon oxynitride, diamond, alumina, or aluminum nitride. By adjusting the thickness of this second dielectric layer 24, the frequency characteristics of the surface acoustic wave resonator 20 can be adjusted. As a result, the frequency characteristics of the surface acoustic wave filter device 1 can be adjusted. Thus, when the second dielectric layer 24 is provided, the surface acoustic wave filter device 1 can be manufactured with excellent frequency accuracy. In addition, after manufacturing, the frequency characteristics, such as filter characteristics, can be easily adjusted.

In addition, the thickness of the second dielectric layer 24 is not particularly limited as long as an elastic wave excited at the IDT electrode 22 is allowed to become a surface acoustic wave. The thickness of the second dielectric layer 24 may preferably be set, for example, in a range of about $0.002\lambda$ to about $0.05\lambda$ ($\lambda$ is the wavelength determined by the pitch between the electrode fingers of the IDT electrode).

Furthermore, in this preferred embodiment, between the first dielectric layer 23 and the piezoelectric substrate 21, a third dielectric layer 25 is preferably provided. A primary surface 21a of the piezoelectric substrate 21 and an upper surface 22a and side surfaces 22b and 22c of the IDT electrode 22 are directly covered by the third dielectric layer 25. The third dielectric layer 25 is in direct physical contact with the primary surface 21a of the piezoelectric substrate 21 and the upper surface 22a and the side surfaces 22b and 22c of the IDT electrode 22.

The third dielectric layer 25 is preferably made of a dielectric material different from that of the first dielectric layer 23. The third dielectric layer 25 may preferably be made of, for example, silicon nitride, silicon oxynitride, diamond, alumina, or aluminum nitride. In addition, the third dielectric layer 25 may have an acoustic velocity greater or less than that of the first dielectric layer 23.

The thickness of the third dielectric layer 25 is equal or substantially equal to or less than that of the first dielectric layer 23 and is preferably, for example, at least about 1.5% of the wavelength determined by the pitch between the electrode fingers of the IDT electrode 22.

In addition, methods for forming the first to the third dielectric layers 23 to 25 are not particularly limited. The first to the third dielectric layers 23 to 25 may be formed, for example, by a sputtering method or a CVD method.

As described above, in this preferred embodiment, between the first dielectric layer 23 and the piezoelectric substrate 21, the third dielectric layer 25 is preferably arranged so as to cover the primary surface 21a of the piezoelectric substrate 21 and the upper surface 22a and the side surfaces 22b and 22c of the IDT electrode 22. Thus, by changing the thickness of the third dielectric layer 25, the acoustic velocity relationship between a plurality of types of surface acoustic waves excited by the IDT electrode 22 may be shifted. Accordingly, the frequency of spurious response caused by an unnecessary surface acoustic wave may be set far from the resonant frequency and the anti-resonant frequency of the main mode which is used to obtain the performance of the device.

For example, when the piezoelectric substrate 21 is a 120° to 130° rotated Y-cut X-propagation $LiNbO_3$ substrate, the Rayleigh wave is used as a main mode, and the SH wave is set as an unnecessary wave, a frequency position of spurious response caused by the SH wave may be located at an outer side portion of the frequency band between the resonant frequency and the anti-resonant frequency of the Rayleigh wave or outside the passband set by the Rayleigh wave. As a result, excellent frequency characteristics are effectively achieved.

In addition, for example, when the piezoelectric substrate 21 is a −10° to 10° rotated Y-cut X-propagation $LiNbO_3$ substrate, the SH wave is used as a main mode, and the Rayleigh wave is set as an unnecessary wave, a frequency position of spurious response caused by the Rayleigh wave may be located at an outer side portion of the frequency band between the resonant frequency and the anti-resonant frequency of the SH wave or outside the passband set by the SH wave. As a result, excellent frequency characteristics are effectively achieved.

Hereinafter, this effect will be described in detail with reference to particular non-limiting examples.

Figure 4:
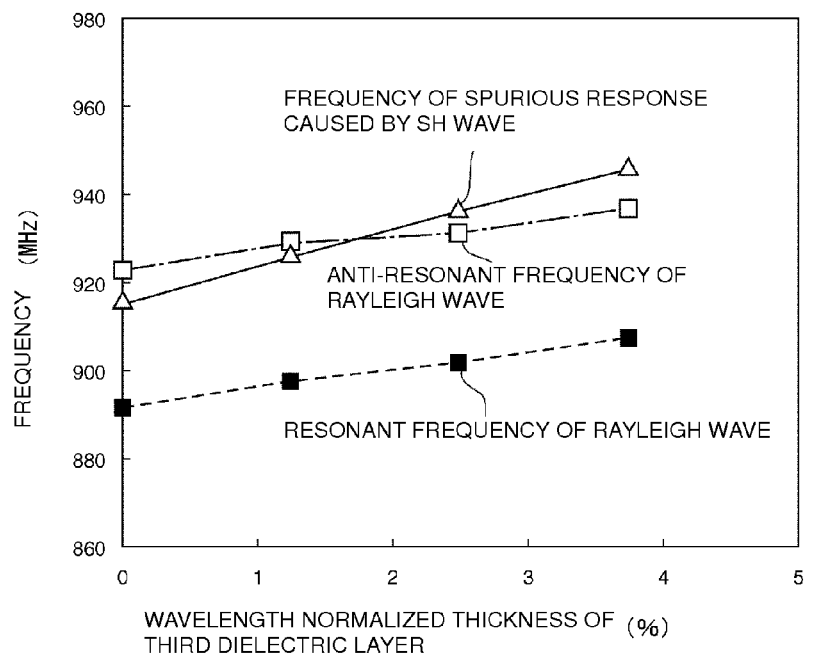
FIG. 4 is a graph showing, in a surface acoustic wave resonator of an experimental example, the relationship between the thickness of a third dielectric layer and frequency characteristics of a surface acoustic wave.
Figure 5:
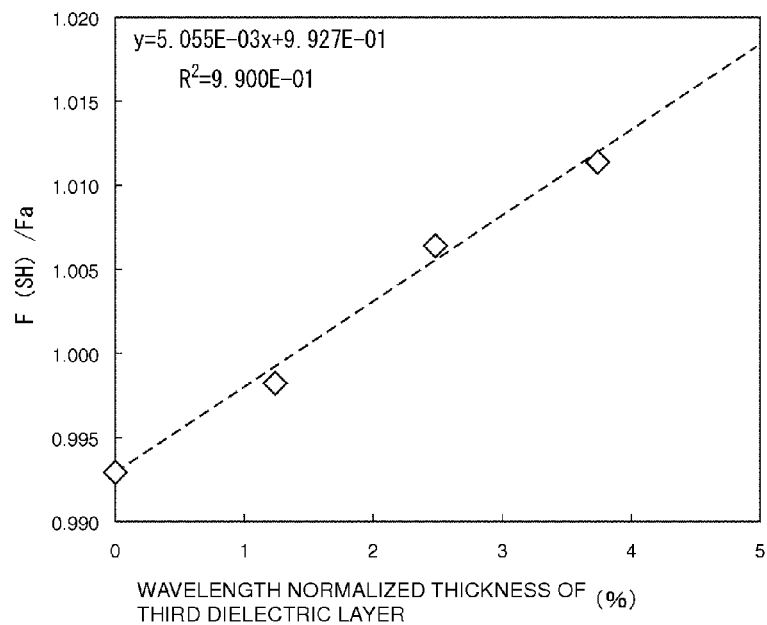
FIG. 5 is a graph showing, in the surface acoustic wave resonator of the experimental example, the relationship between the thickness of the third dielectric layer and the ratio of the frequency of spurious response caused by the SH wave to the anti-resonant frequency of the Rayleigh wave (frequency F (SH) of the spurious response caused by the SH wave/anti-resonant frequency (Fa) of the Rayleigh wave).
Figure 6:
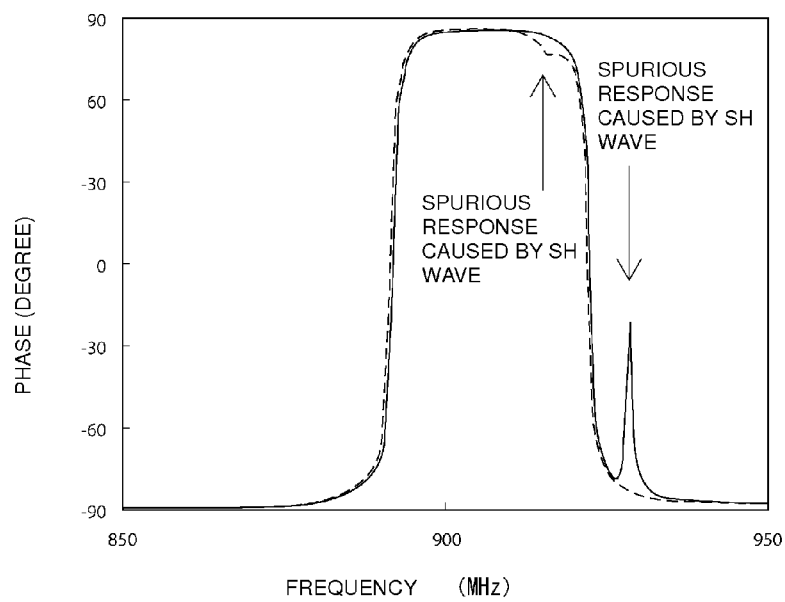
FIG. 6 is a graph showing the phase characteristic of the surface acoustic wave resonator of the experimental example.

First, in accordance with the following design parameters, surface acoustic wave resonators each having substantially the same structure as that of the surface acoustic wave resonator 20 described above were formed by variously changing the thickness of the third dielectric layer, and the resonant frequency and the anti-resonant frequency of the Rayleigh wave which was a main mode and a frequency position of spurious response caused by the SH wave which was an unnecessary wave were measured. In addition, the ratio (F(SH)/Fa) of the frequency of spurious response caused by the SH wave to the anti-resonant frequency of the Rayleigh wave was calculated. The results are shown in FIGS. 4 and 5. In addition, in FIGS. 4 and 5, the horizontal axis indicates the thickness of the third dielectric layer normalized by the wavelength (λ). In addition, in FIG. 6, the phase characteristic obtained when the wavelength normalized thickness of the third dielectric layer is about 2.5% is shown by a solid line, and the phase characteristic obtained when the wavelength normalized thickness of the third dielectric layer is about 0% is shown by a dotted line.

Design Parameters of Surface Acoustic Wave Resonator

Piezoelectric substrate: 129° rotated Y-cut X-propagation $LiNbO_3$ substrate

Structure of IDT electrode: Ti film (thickness: about 10 nm)/AlCu film (thickness: about 130 nm, Cu content: about 10 percent by mass)/Ti film (thickness: about 10 nm)/Pt film (thickness: about 80 nm)/NiCr film (thickness: about 10 nm)/piezoelectric substrate Wavelength of IDT electrode (λ): about 4.0 μm Duty of IDT electrode: about 0.48

First dielectric layer: $SiO_2$ film with a thickness of about 1,100 nm

Second dielectric layer: $Si_3N_4$ film with a thickness of about 40 nm

Third dielectric layer: $Si_3N_4$ film with a thickness of about 0 nm, about 50 nm, about 100 nm, or about 150 nm From the results shown in FIGS. 4 and 5, it is found that as the wavelength normalized thickness of the third dielectric layer is increased, the resonant frequency and the anti-resonant frequency of the Rayleigh wave and the frequency of spurious response caused by the SH wave are all shifted to a high frequency side. However, with respect to the amount of change in wavelength normalized thickness of the third dielectric layer, the amount of change in resonant frequency and that in anti-resonant frequency of the Rayleigh wave are relatively small, and the amount of change in frequency of spurious response caused by the SH wave is relatively large. Thus, when the third dielectric layer is not provided (when the wavelength normalized thickness of the third dielectric layer is 0%), although the frequency of spurious response caused by the SH wave is located in the frequency band between the resonant frequency and the anti-resonant frequency of the Rayleigh wave, when the wavelength normalized thickness of the third dielectric layer is increased, the frequency of spurious response caused by the SH wave is located at a higher region side than the frequency band between the resonant frequency and the anti-resonant frequency of the Rayleigh wave. In particular, as shown in FIG. 4, when the wavelength normalized thickness of the third dielectric layer is set to about 1.5% or more, the frequency of spurious response caused by the SH wave can be located at a higher region side than the frequency band between the resonant frequency and the anti-resonant frequency of the Rayleigh wave. Thus, the degradation in frequency characteristics resulting from the spurious response caused by the SH wave, which is an unnecessary wave, is effectively prevented or decreased.

In addition, as described above, since the change mode in frequency characteristics of the Rayleigh wave and that of the SH wave with respect to the wavelength normalized thickness of the third dielectric layer are different from each other, when the SH wave is used as a main mode, and the Rayleigh wave is set as an unnecessary wave, with the third dielectric layer provided as described above, the degradation in frequency characteristics resulting from the spurious response caused by an unnecessary wave are also effectively prevented or decreased.

Figure 7:
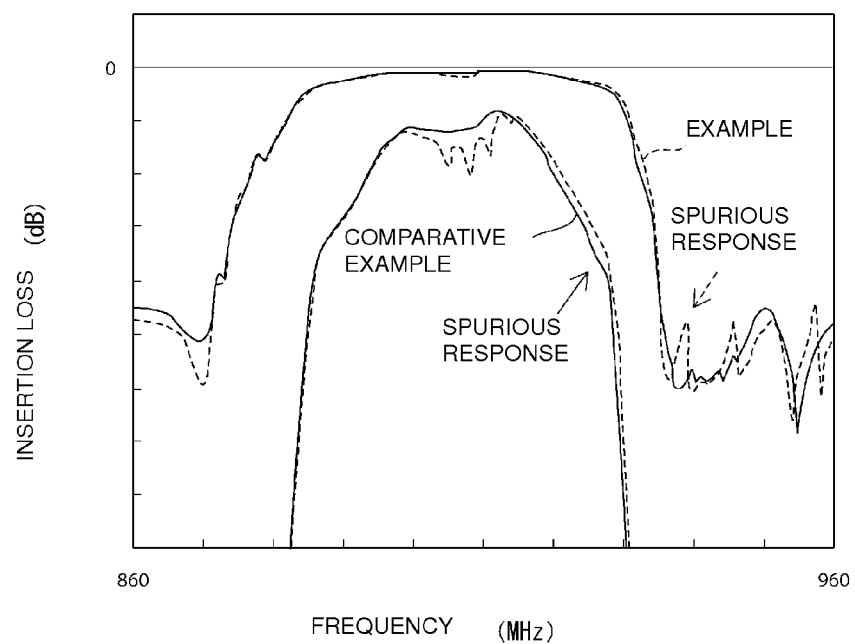
FIG. 7 is a graph showing insertion losses of surface acoustic wave filter devices of an example and a comparative example.

Next, as an example, a surface acoustic wave filter device having the structure similar to that of the above-described surface acoustic wave filter device 1 was produced with the following design parameters, and the insertion loss was measured. The result is shown in FIG. 7 by a dotted line.

In addition, as a comparative example, a surface acoustic wave filter device having the structure similar to that of the surface acoustic wave filter device described above was produced except that the third dielectric layer was not provided, and the insertion loss was measured. The result is shown in FIG. 7 by a solid line.

Design Parameters of Example

Piezoelectric substrate: 129° rotated Y-cut X-propagation $LiNbO_3$ substrate

Structure of IDT electrode: Ti film (thickness: about 10 nm)/AlCu film (thickness: about 130 nm, Cu content: about 10 percent by mass)/Ti film (thickness: 10 nm)/Pt film (thickness: 80 nm)/NiCr film (thickness: about 10 nm)/piezoelectric substrate First dielectric layer: $SiO_2$ film with a thickness of about 1,000 nm Second dielectric layer: $Si_3N_4$ film with a thickness of about 40 nm Third dielectric layer: $Si_3N_4$ film with a thickness of about 100 nm

TABLE 1

| Resonator | Number of Pairs (Pairs) | Intersection Width (μm) | Wavelength (λ) (μm) | Duty Ratio |
|---|---|---|---|---|
| S1 | 140 | 58 | 3.95 | 0.49 |
| P1 | 102 | 101 | 4.11 | 0.50 |
| S2 | 134 | 64 | 3.96 | 0.48 |
| P2 | 83 | 83 | 4.13 | 0.50 |
| S3 | 126 | 64 | 3.95 | 0.49 |
| P3 | 88 | 86 | 4.1 | 0.50 |
| S4-1 | 162 | 98 | 3.97 | 0.50 |
| S4-2 | 162 | 91 | 3.89 | 0.50 |

As shown in FIG. 7, in the comparative example (solid line in FIG. 7), the spurious response caused by the SH wave which is an unnecessary wave is generated at a high region side portion in the passband, and the insertion loss at the high region side portion in the passband is increased. On the other hand, in the example (dotted line in FIG. 7), since the spurious response is located at a higher region side than the passband, that is, outside the passband, an increase in insertion loss at the high region side portion in the passband is prevented or minimized, and as a result, the insertion loss in the passband is improved. From the results described above, when the third dielectric layer is provided, the increase in insertion loss in the passband is prevented or minimized.

In addition, when the third dielectric layer is provided between the first dielectric layer and the piezoelectric substrate so as to cover the surface of the piezoelectric substrate and the upper surface and the side surfaces of the IDT electrode, the second dielectric layer may not be provided. Even in this case, since the frequency characteristics of a main mode and that of spurious response which is an unnecessary wave are confirmed to behave differently from each other with respect to the thickness of the third dielectric layer, it is understood that the effects of preferred embodiments of the present application are still obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A surface acoustic wave device comprising:
    a piezoelectric substrate;
    an IDT electrode provided on the piezoelectric substrate;
    a first dielectric layer provided on the piezoelectric substrate and made of silicon oxide; and
    a second dielectric layer provided on the first dielectric layer and having an acoustic velocity greater than that of the first dielectric layer; wherein
    the surface acoustic wave device further includes a third dielectric layer provided between the first dielectric layer and the piezoelectric substrate so as to cover a surface of the piezoelectric substrate and an upper surface and side surfaces of the IDT electrode; and
    a thickness of the third dielectric layer is at least about $0.015\lambda$, where $\lambda$ is a wavelength of the IDT electrode determined by a pitch between electrode fingers of the IDT electrode.

2. The surface acoustic wave device according to claim 1, wherein a thickness of the third dielectric layer is equal to or less than that of the first dielectric layer.

3. The surface acoustic wave device according to claim 1, wherein the third dielectric layer is made of at least one of silicon nitride, silicon oxynitride, diamond, alumina, or aluminum nitride.

4. The surface acoustic wave device according to claim 1, wherein the second dielectric layer is made of at least silicon nitride, silicon oxynitride, diamond, alumina, or aluminum nitride.

5. The surface acoustic wave device according to claim 1, wherein the piezoelectric substrate is made of one of $LiNbO_3$ or $LiTaO_3$.

6. The surface acoustic wave device according to claim 5, wherein the piezoelectric substrate is a 120° to 130° rotated Y-cut X-propagation $LiNbO_3$ substrate.

7. The surface acoustic wave device according to claim 5, wherein the piezoelectric substrate is a −10° to 10° rotated Y-cut X-propagation $LiNbO_3$ substrate.

8. The surface acoustic wave device according to claim 1, wherein the third dielectric layer is in direct contact with the upper surface and the side surfaces of the IDT electrode.

9. The surface acoustic wave device according to claim 1, wherein the IDT electrode includes a pair of comb-shaped electrodes arranged side by side to one another.

10. The surface acoustic wave device according to claim 1, wherein the IDT electrode is made of a metal selected from the group consisting of Al, Pt, Au, Ag, Cu, Ni, Ti, Cr, and Pd or an alloy including at least one metal selected from the group consisting of Al, Pt, Au, Ag, Cu, Ni, Ti, Cr, and Pd.

11. The surface acoustic wave device according to claim 1, wherein the IDT electrode is defined by a laminate of electrically conductive layers.

12. The surface acoustic wave device according to claim 11, wherein each of the electrically conductive layers is made of a metal selected from the group consisting of Al, Pt, Au, Ag, Cu, Ni, Ti, Cr, and Pd or an alloy including at least one metal selected from the group consisting of Al, Pt, Au, Ag, Cu, Ni, Ti, Cr, and Pd.

13. The surface acoustic wave device according to claim 11, wherein the first dielectric layer is made of silicon oxide.

14. The surface acoustic wave device according to claim 10, wherein a thickness of the first dielectric layer is in a range from approximately a thickness of the IDT electrode to about $0.5\lambda$.

15. The surface acoustic wave device according to claim 11, wherein a thickness of the second dielectric layer is in a range of about $0.002\lambda$ to about $0.05\lambda$.

16. The surface acoustic wave device according to claim 11, wherein the third dielectric layer is made of a material that is different from a material from which the first dielectric layer is made.

* * * * *